(12) United States Patent
Dinant et al.

(10) Patent No.: US 11,781,740 B2
(45) Date of Patent: Oct. 10, 2023

(54) LIGHTING DEVICE FOR A MOTOR VEHICLE

(71) Applicant: VALEO VISION, Bobigny (FR)

(72) Inventors: Franck Dinant, Bobigny (FR); Dirkie Sacchet, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 17/783,130

(22) PCT Filed: Dec. 10, 2020

(86) PCT No.: PCT/EP2020/085526
§ 371 (c)(1),
(2) Date: Jun. 7, 2022

(87) PCT Pub. No.: WO2021/116284
PCT Pub. Date: Jun. 17, 2021

(65) Prior Publication Data
US 2023/0017620 A1    Jan. 19, 2023

(30) Foreign Application Priority Data

Dec. 11, 2019  (FR) ...................................... 1914213

(51) Int. Cl.
| | | |
|---|---|---|
| *F21V 19/00* | (2006.01) | |
| *F21S 45/47* | (2018.01) | |
| *H05K 1/02* | (2006.01) | |
| *H05K 3/40* | (2006.01) | |
| *F21Y 115/10* | (2016.01) | |

(52) U.S. Cl.
CPC .......... *F21V 19/0035* (2013.01); *F21S 45/47* (2018.01); *H05K 1/0215* (2013.01); *H05K 3/4092* (2013.01); *F21Y 2115/10* (2016.08)

(58) Field of Classification Search
CPC .... F21V 19/0035; F21S 45/47; H05K 1/0215; H05K 3/4092; F21Y 2115/10
See application file for complete search history.

(56) References Cited

U.S. PATENT DOCUMENTS

| 2011/0157844 A1 | 6/2011 | Chan et al. |
| 2017/0241618 A1 | 8/2017 | Badia |
| 2017/0241624 A1 | 8/2017 | Badia |

FOREIGN PATENT DOCUMENTS

| DE | 10 2007 036 939 A1 | 2/2009 |
| EP | 3 209 098 A1 | 8/2017 |
| EP | 3 211 293 A1 | 8/2017 |

(Continued)

OTHER PUBLICATIONS

International Search Report dated Feb. 8, 2021, in PCT/EP2020/085526 filed Dec. 10, 2020, 2 pages.

(Continued)

*Primary Examiner* — Anne M Hines
*Assistant Examiner* — Jose M Diaz
(74) *Attorney, Agent, or Firm* — Oblon, McClelland, Maier & Neustadt, L.L.P.

(57) ABSTRACT

Lighting device for a motor vehicle including a light source and/or an optical part. A substrate including electrical tracks, the light source and/or optical part being fastened to the substrate, and a part forming an electrical ground for the electrical tracks. The substrate includes a cut-out forming a tab, electrical tracks of the substrate extending onto the tab, at least one of the tracks on the tab making electrical contact with the ground-forming part.

20 Claims, 3 Drawing Sheets

(56) References Cited

FOREIGN PATENT DOCUMENTS

Figure 1:
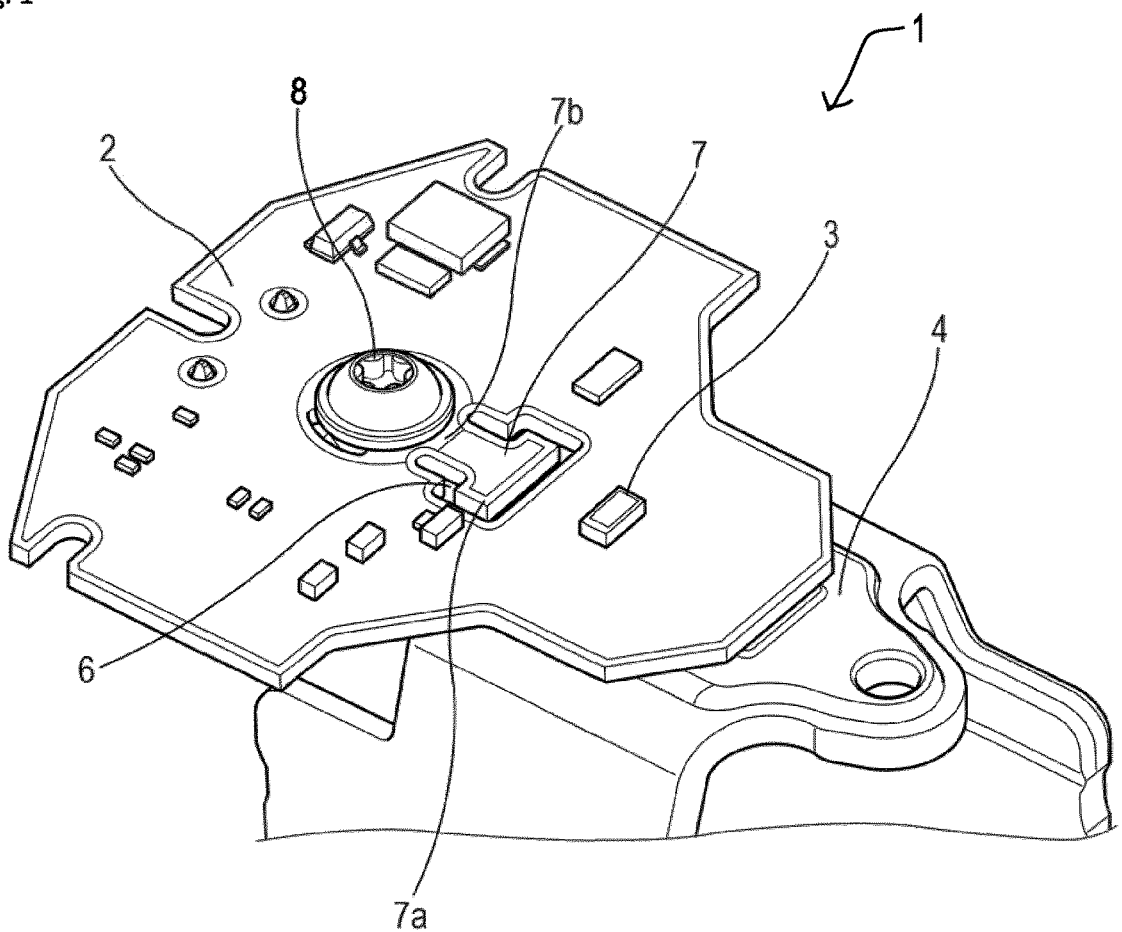

JP       2008-21419 A     1/2008
JP       2015-522929 A   8/2015

OTHER PUBLICATIONS

Notice of Reasons for Refusal dated May 30, 2023 in Japanese Patent Application No. 2022-535758 filed Dec. 10, 2020, with English Translation, total 8 pages.

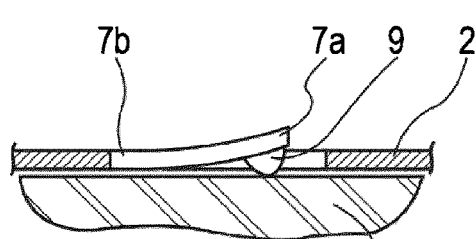
Fig. 3a
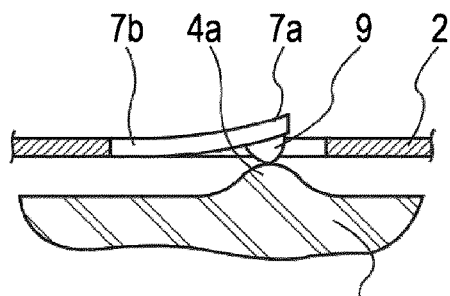
Fig. 3b
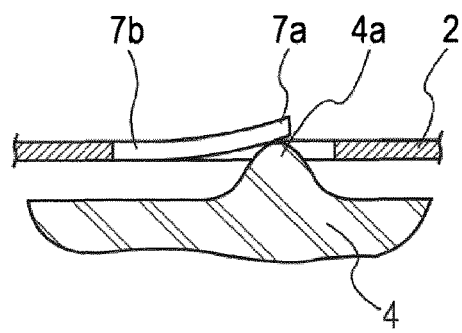
Fig. 3c
Fig. 4
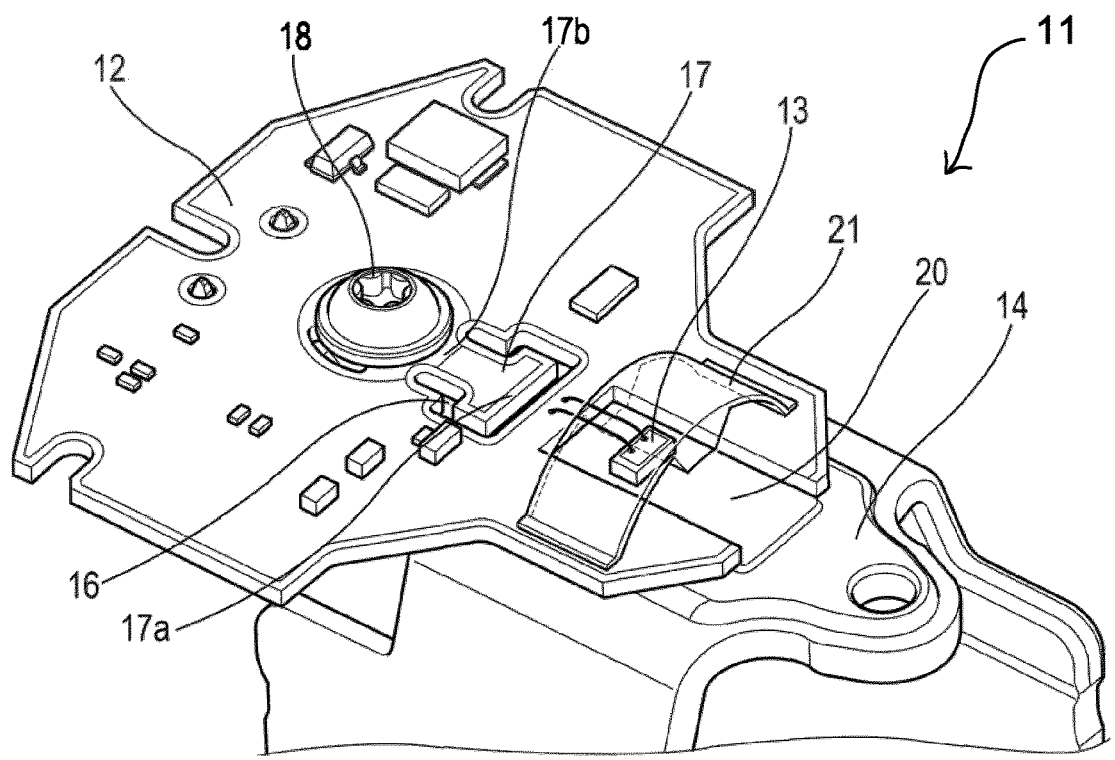
Fig. 4

LIGHTING DEVICE FOR A MOTOR VEHICLE

The present invention relates to a lighting device for a motor vehicle.

It is known for a lighting device to comprise a substrate comprising electric tracks, a semiconductor light source and a ground-forming part, in which said ground-forming part is brought into electrical contact with tracks of the substrate via an added part having a flexible portion that ensures electrical contact between the tracks of the substrate and the ground-forming part. This has the technical effect of preventing electrostatic discharges between the substrate and the ground-forming part while also preventing, by virtue of the deformation of the flexible portion of the added part, a deformation of the substrate. Such a deformation of the substrate would have the effect of moving the LED, which would result in a loss of luminous efficiency.

However, this added part involves manufacturing costs for the lighting device, in terms of supply, material and assembly processes.

The object of the invention is to eliminate these manufacturing costs while limiting movement of the LED and/or of the optical part and/or a decrease in luminous efficiency.

To that end, the subject of the invention is a lighting device for a motor vehicle, comprising:
- a light source and/or an optical part,
- a substrate comprising electrical tracks, said light source being fastened to said substrate,
- a part forming an electrical ground for said electrical tracks.
  - The substrate comprises a cut-out forming a tab, electrical tracks of the substrate extending onto said tab, at least one of said tracks making electrical contact with the ground-forming part. This contact has the effect of preventing electrostatic discharges between the ground-forming part and the substrate.

Advantageously, the contact between the substrate and the ground-forming part is maintained by virtue of an elastic deformation of the tab, preferably by bending, which makes it possible to ensure contact despite wide manufacturing tolerances. What is understood by elastic deformation is that this deformation of the tab is reversible and that when the bearing stress of the tab on the tab contact is released, the part returns to its initial shape. This makes it possible to greatly reduce the cost for obtaining the lighting module.

Advantageously, the substrate is a rigid substrate, as opposed to the flexible substrates known to those skilled in the art as flex-PCBs. Preferably, the substrate has an elastic modulus (known as Young's modulus) greater than 7 GPa, preferably greater than 15 GPa, and preferably greater than 20 GPa, which allows the contact between the substrate and the ground-forming part to hold better, in particular so that contact holds even in the vibratory motor vehicle environment.

Advantageously, the thickness of the substrate is greater than 0.4 mm, preferably greater than 0.8 mm, and preferably close to 1 mm; such a thickness makes it possible to ensure sufficient mechanical strength for the substrate, thereby allowing the contact between the substrate and the ground-forming part to hold better, in particular so that contact holds even in the vibratory motor vehicle environment. It is understood that a rigid and/or thick substrate also contributes to maintaining the light source and/or of the optical part that it supports at a precise height.

Advantageously, the thickness of the substrate is less than 2 mm, preferably less than or equal to 1.6 mm, and preferably less than 1.2 mm. This makes it possible to prevent overly high stresses, in particular shear stresses, in the substrate and excessive loads on the contacts of the tab, which might damage the surface and the conductivity thereof. Preferably, the substrate is a rigid substrate such as FR4, or alternatively an insulated metal substrate, for example an aluminum substrate covered with a dielectric layer. In one preferred embodiment, the substrate is made of FR4, has a Young's modulus greater than 20 GPa, and has a thickness close to 1 mm.

The deformation for contact between the substrate and the ground-forming part is concentrated at the tab. In this way, the effects of this deformation on the rest of the substrate are therefore limited. In particular, movement of said light source and/or optical part in a direction perpendicular to the plane of the substrate, and/or a loss of luminous efficiency, are limited.

For example, residual deformations and movements of the substrate do not cause the light source and/or optical part to move, which would entail a loss of performance of the lighting device; in particular, a regulatory function of the lighting device is ensured despite residual deformation. This effect is particularly advantageous in the case where the lighting device comprises an optical system for deviating a light beam from the light source and/or from the optical part, in particular when the position of said optical system is independent of deformations of the substrate. The limited deformation of the substrate then allows a light beam from the light source and/or from the optical part and directed toward said optical system to be correctly deviated by the latter. Luminous efficiency of the lighting device is therefore further improved.

In addition, the electrical contact between the ground-forming part and the tracks of the substrate is established without the use of an added part. The manufacturing costs for the lighting device due to an added part are then eliminated.

The lighting module according to the invention may optionally have one or more of the following features:
- a light source is fastened to the substrate,
- the light source is a semiconductor source, that is to say a light-emitting diode, commonly referred to by the abbreviation LED.
- an optical part is fastened to the substrate,
- the optical part comprises a lens,
- the optical part deviates a light beam from the light source,
- the light source is an LED mounted on a submount, referred to hereinafter as a "submount-mounted LED",
- said submount-mounted LED is directly secured to the surface of the ground-forming part,
- said submount-mounted LED is directly secured to an optical part fastened to the substrate,
- said submount-mounted LED is positioned such that light emitted by the submount-mounted LED passes through a through-opening in the substrate,
- said submount-mounted LED is connected to electrical tracks of the substrate by wire connections, using the technology commonly referred to as "wire-bonding",
- said submount-mounted LED cooperates with said optical part fastened to the substrate,
- the ground-forming part is a heat sink,
- said ground-forming part is a heat sink on which said submount-mounted LED is positioned, said ground-forming part is a heat sink on which said submount-mounted LED is positioned, said submount-mounted LED cooperating with the optical part fastened to the substrate, said ground-forming part comprises a portion inside the module and a portion outside the module, said heat sink is fastened to a frame of the lighting device, said heat sink is made of metal material; this increases its efficiency, said metal material is based on aluminum; this is advantageous both for heat dissipation and the weight of the part in question, and from an economic point of view, said frame is made of plastic; this is advantageous from an economic point of view, said frame is overmolded onto the heat sink; this makes it possible to seal the module in an ideal manner when the heat sink has a portion inside and a portion outside the lighting module, an optical system is arranged so as to deviate a light beam from the light source and/or from the optical part; in this way, luminous efficiency of the lighting device is improved, a position of said optical system is independent of the deformation of the substrate; in this way, luminous efficiency of the lighting device is improved, the heat sink is in thermal contact with the LED and/or the optical part fastened to the substrate, a thermal conductor is affixed to an area of the substrate excluding a zone of contact between the electrical tracks and the heat sink; in this way, thermal contact between the substrate and the heat sink is achieved without creating undesirable electrical contact between the tracks of the substrate and the ground-forming part, the thermal conductor is, for example, a thermal paste or a thermal grease, the tab comprises at least one deposit of conductive material on at least a portion of the tracks of the tab in electrical contact with the ground-forming part; this deposit has the technical effect of protecting the tracks of the tab from wear due to mechanical contact with the ground-forming part, said deposit of electrically conductive material is a deposit of a metal material; in this way, wear on the deposit of material is limited, said deposit of conductive material comprises tin; in this way, the cost of producing the deposit is decreased, the deposit of electrically conductive material on at least a portion of the tracks of the tab in electrical contact with the ground-forming part constitutes a protuberance; this has the effect of facilitating mechanical contact with the ground-forming part, the ground-forming part comprises at least one protuberance arranged so as to ensure electrical contact with at least a portion of the tracks of the tab, said protuberance of the ground-forming part is made without adding material; for example, it arises directly from the molding, machining, forging, or other operations without adding material that are performed on the ground-forming part, the cut-out is a void in a rim of the substrate; in this way, the tab may be formed on a rim of the substrate, the cut-out is a void in a portion of the substrate not adjacent to a rim of the substrate; in this way, the tab may be formed on a portion of the substrate not adjacent to a rim of the substrate, the cut-out is a slot, i.e. it is narrow; in this way, making the cut-out requires the removal of less surface area from the substrate, which is costly; when the slot is narrow, the space available for electronic components is therefore maximized, and the manufacturing cost for the substrate is therefore decreased, preferably, the distance from one edge of the slot to the other is of the order of magnitude of the thickness of the substrate; in this way, the thickness of the substrate does not hinder movement caused by bending of the tab; specifically, the friction in an overly narrow slot could hinder or prevent this type of movement, the tab extends between a base and a free end, the base being adjacent to a means for fastening the substrate to a frame of the lighting device; in this way, the deformation of the tab has no effect on the other regions of the substrate, in particular those comprising the LED and/or the optical part, the fastening means is located in a central region of the substrate, the fastening means is a screw, the fastening means is a heading pin, the substrate is a printed circuit board (PCB), the substrate is a multilayer PCB comprising at least three layers of electrical tracks, a layer of electrical tracks of the multilayer PCB which is located on the side of the ground-forming part is dedicated to grounding, the substrate is made of epoxy, in particular FR4 epoxy, the lighting device is a front fog light, the lighting device is a low beam, a high beam, a position light, a daytime running light, a rear light, a rear fog light or a brake light, the lighting device is a device for lighting the interior of the vehicle.

A material is electrically conductive when a measured electrical conductivity of such a material is close to the electrical conductivity of alloys based on tin and/or copper and/or gold and/or platinum and/or iron. Conversely, a material is not electrically conductive when a measured electrical conductivity of such a material is close to that of an epoxy substrate.

Figure 2A:
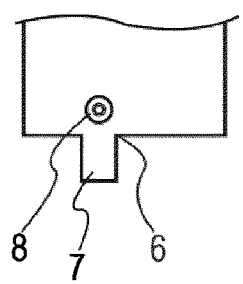
Figure 2B:
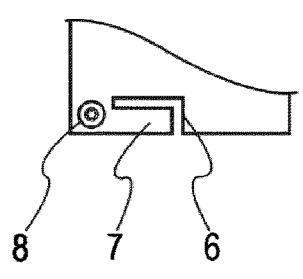
Figure 2C:
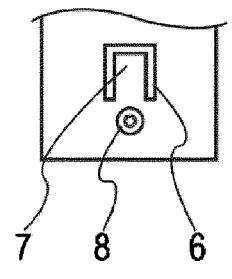
Figure 2D:
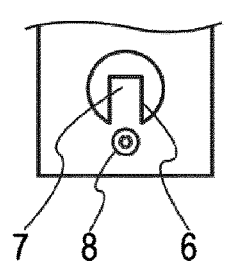
Figure 5:
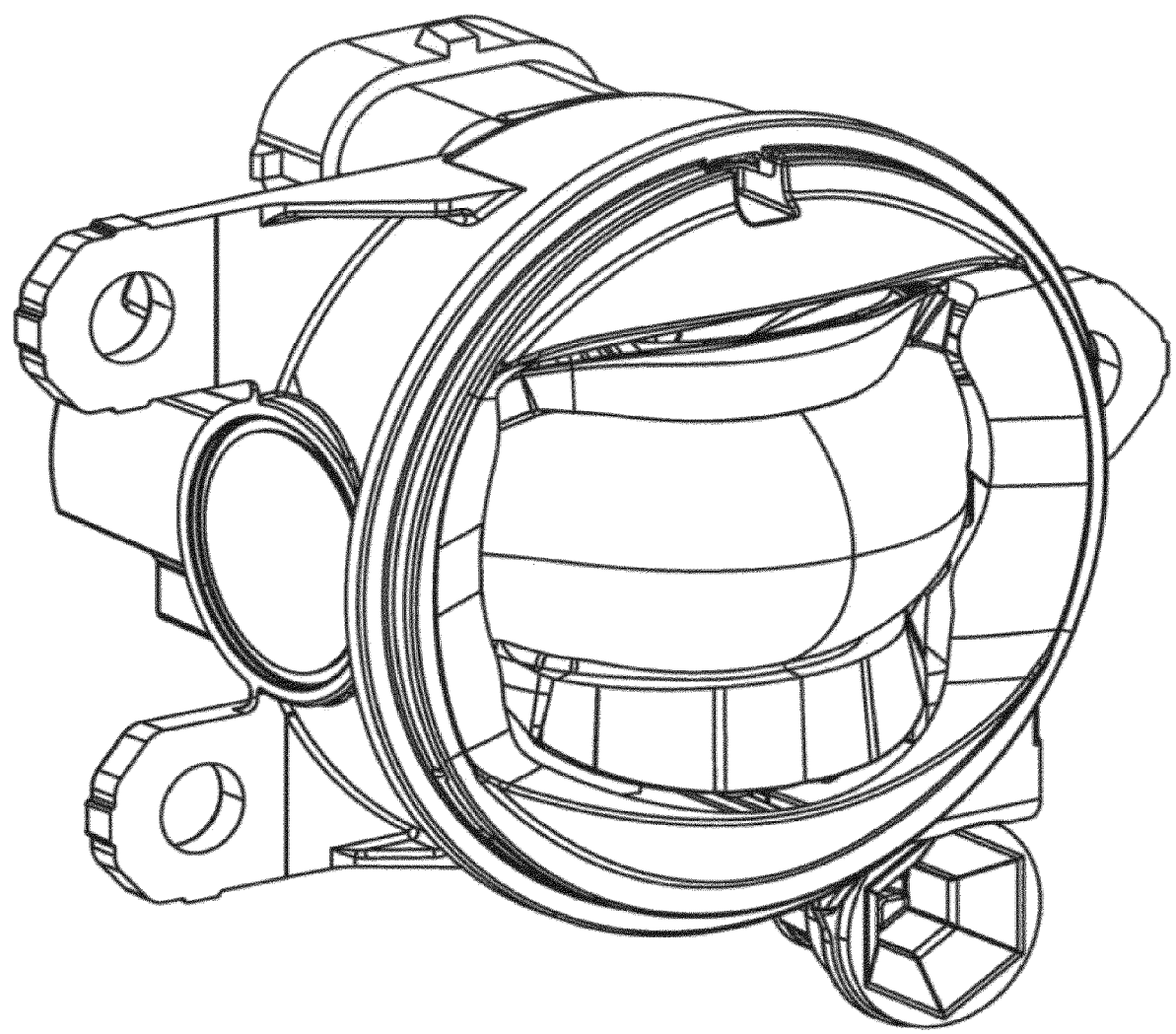

Other features and advantages of the invention will become apparent from reading the following detailed description of one embodiment, for the understanding of which reference should be made to the appended drawings, in which:

FIG. 1 is a perspective view of a lighting device for a motor vehicle according to the invention, in which an LED 3 is fastened to the substrate 2 and the ground-forming part 4 is a heat sink in thermal contact with the LED 3, FIG. 2a is a view from above of a tab (7) formed by cutting out an edge of the substrate (2), FIG. 2b is a view from above of a tab (7) formed by cutting out an edge of the substrate (2), the cut-out (6) forming a slot, FIG. 2c is a view from above of a tab (7) formed by cutting out non-adjacently to an edge of the substrate, the cut-out forming a slot, FIG. 2d is a view from above of a tab (7) formed by cutting out non-adjacently to an edge of the substrate, said cut-out not forming a slot, FIG. 3a shows a tab (7) comprising a base (7b) and a free end (7a) on which a tin deposit forming a protuberance (9) has been made, FIG. 3b shows a tab (7) comprising a base (7b) and a free end (7a) on which a tin deposit forming a protuberance (9) has been made, ensuring electrical contact with a ground-forming part (4) comprising a protuberance (4a), FIG. 3c shows a tab (7) comprising a base (7b) and a free end (7a) on which a tin deposit forming a protuberance (9) has been made, FIG. 4 is a sectional view of a device according to the invention in which an LED is mounted on a submount secured to the heat sink and an optical part is fastened to the substrate, FIG. 5 is a perspective view of a fog light according to the invention.

A lighting device (1) comprises a substrate (2), a ground-forming part (4), and an LED (3), said LED (3) being fastened to the substrate (2). The substrate has a cut-out (6) forming a tab (7).

In one preferred embodiment illustrated in FIG. 1, the ground-forming part (4) is a heat sink formed of an aluminum element, in thermal contact with the LED (3).

In the embodiment illustrated in FIG. 1, a frame (not shown) of the lighting device (1) is molded onto the ground-forming part (4). The cut-out (6) is a void forming a tab (7), which comprises a base (7b) and a free end (7a). The base (7b) is adjacent to a means (8) for fastening the substrate (2) to the frame, consisting of a screw. The device comprises an optical system (not shown) arranged so as to deviate the light rays emitted by the LED (3). Said optical system is fastened to the frame of the lighting device (1): the position of said optical system is therefore here independent of deformations of the substrate.

In the embodiment illustrated in FIG. 3a, the tab (7) comprising a base (7a) and a free end (7b) comprises a tin deposit (9) forming a protuberance. The ground-forming part (4) comprises a protuberance (4a) which cooperates with the tin deposit (9) so as to ensure electrical contact between at least one of the electrical tracks of the tab (7) and the heat sink (4).

In the embodiment illustrated in FIG. 3b, the tab (7) comprising a base (7a) and a free end (7b) does not comprise a protuberance. The ground-forming part (4) comprises a protuberance (4a) which cooperates with the free end (7b) of the tab so as to ensure electrical contact between at least one of the electrical tracks of the tab (7) and the heat sink (4).

In the embodiment illustrated in FIG. 3c, the tab (7) comprising a base (7a) and a free end (7b) comprises a tin deposit (9) forming a protuberance. The ground-forming part (4) does not comprise a protuberance; it is a planar surface which cooperates with the free end (7b) of the tab so as to ensure electrical contact between at least one of the electrical tracks of the tab (7) and the heat sink (4).

In all of the embodiments illustrated in FIGS. 1 to 3b, the tab formed by the cut-out (6) is deformed so as to ensure electrical contact between an electrical track on a free end of the tab (7a) and the heat sink (4), and the base (7b) of the tab is held on the frame by the fastening screw (8). In this way, deformation of the tab (7) does not cause deformation of the substrate: vertical movement of the LED (3) is thus limited and any loss of luminous efficiency of the module (1) is thus prevented.

In the embodiment illustrated in FIG. 4, the ground-forming part is a heat sink (14) and the light source is a submount-mounted LED (13). Said LED (13) is secured to the heat sink (14), electrically connected to the tracks of the substrate by wire connections, and emits light through a through-opening (20) through the substrate (12). An optical part (21) is fastened to the substrate so as to deviate a light beam emitted by the LED (13). A frame (not shown) of the lighting device (11) is molded onto the heat sink (14). The cut-out (16) is a void forming a tab (17), which comprises a base (17b) and a free end (17a). The base (17b) is adjacent to a means (18) for fastening the substrate (12) to the frame, consisting of a screw. An optical system (not shown) is arranged so as to deviate a light beam from the optical part (21). Said optical system is fastened to the frame of the lighting device (11): the position of said optical system is therefore independent of deformations of the substrate.

In the embodiment illustrated in FIG. 4, the tab formed by the cut-out (6) is deformed so as to ensure electrical contact between an electrical track on a free end of the tab (7a) and the heat sink (4), and the base (7b) of the tab is held on the frame by the fastening screw (8). In this way, deformation of the tab (7) does not cause deformation of the substrate: vertical movement of the optical part (3) is thus limited and any loss of luminous efficiency of the module (1) is thus prevented.

The above description clearly explains how the invention achieves the objectives that were set therefor, and in particular how manufacturing costs due to the use of an added part to ensure contact between the substrate and the ground-forming part are eliminated while limiting movement of the LED and/or of the optical part and/or a decrease in luminous efficiency.

The invention is not limited to the embodiments specifically given in this document by way of non-limiting examples, and extends in particular to all equivalent means and to any technically operational combination of these means. Thus, the features, variants and various embodiments of the invention may be combined with one another, in various combinations, as long as they are not mutually incompatible or mutually exclusive.

The invention claimed is:
1. A lighting device, comprising:
a light source and/or an optical part;
a substrate comprising electrical tracks, the light source and/or optical part being fastened to the substrate; and
a part forming an electrical ground for the electrical tracks,
wherein the substrate comprises a cut-out forming a tab, the electrical tracks of the substrate extending onto the tab, at least one of the electrical tracks on the tab making electrical contact with the part forming the electrical ground,
wherein a contact between the tab and the part is maintained by elastic deformation of the tab.

2. The lighting device as claimed in claim 1, wherein the part is a heat sink.

3. The lighting device as claimed in claim 1, wherein the tab comprises at least one deposit of an electrically conductive material on at least a portion of the at least one of the electrical tracks on the tab in electrical contact with the part.

4. The lighting device as claimed in claim 3, wherein the at least one deposit of the electrically conductive material forms a protuberance.

5. The lighting device as claimed in claim wherein the cut-out is a slot or a void.

6. The lighting device as claimed in claim 1, further comprising an optical system arranged to deviate a light beam emitted by the light source and/or the optical part, a position of the optical system being independent of deformation of the substrate.

7. The lighting device as claimed in claim 1, wherein the lighting device is a fog light.

8. The lighting device as claimed in claim 1, wherein the part comprises at least one protuberance arranged so as to ensure electrical contact with at least a portion of the at least one of the electrical tracks on the tab.

9. The lighting device as claimed in claim 1, wherein the tab extends between a base and a free end, the base being adjacent to a means for fastening the substrate to a frame of the lighting device.

10. The lighting device as claimed in claim 4, wherein the tab extends between a base and a free end.

11. The lighting device as claimed in claim 10, wherein the protuberance is formed below the free end so that the free end is elevated relative to the base.

12. A lighting device, comprising:
a light source and/or an optical part;
a substrate comprising electrical tracks, the light source and/or optical part being fastened to the substrate; and
a part forming an electrical ground for the electrical tracks,
wherein the substrate comprises a cut-out forming a tab, the electrical tracks of the substrate extending onto the tab, at least one of the electrical tracks on the tab making electrical contact with the part forming the electrical ground,
wherein the part comprises at least one protuberance arranged so as to ensure electrical contact with at least a portion of the at least one of the electrical tracks on the tab.

13. The lighting device as claimed in claim 12, wherein the cut-out is a slot or a void.

14. The lighting device as claimed in claim 12, further comprising an optical system arranged to deviate a light beam emitted by the light source and/or the optical part, a position of the optical system being independent of deformation of the substrate.

15. The lighting device as claimed in claim 12, wherein a contact between the tab and the part is maintained by elastic deformation of the tab.

16. The lighting device as claimed in claim 12, wherein the lighting device is a fog light.

17. A lighting device, comprising:
a light source and/or an optical part;
a substrate comprising electrical tracks, the light source and/or optical part being fastened to the substrate; and
a part forming an electrical ground for the electrical tracks,
wherein the substrate comprises a cut-out forming a tab, the electrical tracks of the substrate extending onto the tab, at least one of the electrical tracks on the tab making electrical contact with the part forming the electrical ground,
wherein the tab extends between a base and a free end, the base being adjacent to a means for fastening the substrate to a frame of the lighting device.

18. The lighting device as claimed in claim 17, wherein the fastening means is a screw.

19. The lighting device as claimed in claim 17, wherein the part comprises at least one protuberance arranged so as to ensure electrical contact with at least a portion of the at least one of the electrical tracks on the tab.

20. The lighting device as claimed in claim 17, wherein the cut-out is a slot or a void.

* * * * *